United States Patent [19]
Guay et al.

[11] Patent Number: 5,945,860
[45] Date of Patent: Aug. 31, 1999

[54] CLM/ECL CLOCK PHASE SHIFTER WITH CMOS DIGITAL CONTROL

[75] Inventors: Bernard Guay, Montreal; Michael Altmann, Kanata, both of Canada

[73] Assignee: Northern Telecom Limited, Montreal, Canada

[21] Appl. No.: 08/583,169

[22] Filed: Jan. 4, 1996

[51] Int. Cl.[6] .............................. H03K 5/13; H03K 3/00
[52] U.S. Cl. ............................................ 327/246; 327/237
[58] Field of Search ..................................... 327/231, 232, 327/233, 234, 236–240, 246, 247, 249, 254–258, 355, 357, 359, 361, 562, 563; 326/66, 127, 109, 110

[56] References Cited

U.S. PATENT DOCUMENTS

| | | | |
|---|---|---|---|
| 3,956,643 | 5/1976 | Hite ......................................... | 327/357 |
| 4,546,275 | 10/1985 | Pena-Finol et al. ..................... | 327/357 |
| 4,663,594 | 5/1987 | Perkins .................................... | 327/246 |
| 4,709,170 | 11/1987 | Li ............................................. | 327/246 |
| 4,922,127 | 5/1990 | Denny ...................................... | 327/247 |
| 4,935,701 | 6/1990 | Kawai et al. ............................ | 327/248 |
| 5,015,872 | 5/1991 | Rein ......................................... | 327/234 |
| 5,115,409 | 5/1992 | Stepp ....................................... | 364/841 |
| 5,157,276 | 10/1992 | Metz ........................................ | 327/237 |
| 5,168,250 | 12/1992 | Bingham ................................. | 333/139 |
| 5,294,841 | 3/1994 | Magarshack ............................ | 307/262 |
| 5,317,276 | 5/1994 | Yamamoto ............................... | 328/155 |
| 5,448,772 | 9/1995 | Grandfield .............................. | 327/357 |

OTHER PUBLICATIONS

Patent Abstracts of Japan, vol. 7, No. 226, (E–202), '1371, Oct. 7, 1983, & JP 58 115916 a (Sony K.K.), Abstract.

*Primary Examiner*—My-Trang Nu Ton
*Attorney, Agent, or Firm*—Aprilia U. Diaconescu

[57] ABSTRACT

A CML/ECL clock phase shifter device provides a 360° phase control range and, upon being provided with two CML clock signals related by a known phase difference, the device produces any desired phase in response to a control signal. The device uses a CMOS current switch which generates current signals having the amplitude adjustable with the control signal, which is a digital word. Differential pairs provide amplitude modulated current signals for the input clock and the variant of the input clock. Two MOS transmission networks selectively invert each amplitude modulated signal and sum the signals from each side on a load network. The phase control resolution is optimal over four quadrants for quadrature input clock signals.

14 Claims, 5 Drawing Sheets

CLM/ECL CLOCK PHASE SHIFTER WITH CMOS DIGITAL CONTROL

FIELD OF THE INVENTION

This invention relates to a phase shifter circuit and more specifically to a CLM/ECL phase shifter with CMOS digital control.

BACKGROUND OF THE INVENTION

The need often arises to generate phase shifted versions of a clock signal. Timing recovery circuits and delay-locked loops are two examples. Existing clock phase shifting circuits are based on cascaded delay cells, variable delay cells or mixing circuits. In the latter case, the output of the phase shift control is an analog signal which is prone to corruption by noise or crosstalk. Digital control can be achieved in this case through use of a digital-to-analog converter.

In some cases when CMOS and CML/ECL technologies are used in the same device, translators or resistive networks are needed to translate the CMOS control signal to an CML/ECL format. Provision of such circuits results in higher complexity and power dissipation.

In addition, mixed based clock phase shifter circuits typically have the phase control range limited to 90°.

CMOS and CML/ECL technologies are currently used within the same integrated circuit in an effort to reduce power dissipation and improve performance. Therefore, the need arises for a CMOS signal to act as the control signal for CML/ECL circuits, especially for high speed logic circuits.

SUMMARY OF THE INVENTION

It is a primary object of present invention to provide a mixer based CML/ECL clock phase shifter with CMOS digital control which overcomes totally or in part the drawbacks associated with the prior art phase shifters.

It is another object of the present invention to provide a CML/ECL phase shifter with a CMOS digital control signal which does not use translators or resistive networks to translate the CMOS control signal to an CML/ECL format.

The device of the present invention uses a CML/ECL arrangement, together with a complementary MOS current source with adjustable current output. The device combines the high speed CML/ECL logic signals with a low speed single-ended CMOS control signal and does not require a complementary input or reference signal.

It is still another object of the present invention to provide a clock phase shifter with an output clock having a phase that can be programmed to take any value between 0° and 360°.

The phase shifter according to the present invention provides a 360° phase control range and operates under the control of a CMOS digital word. Upon being provided with two CML clock signals related by a known fixed phase difference, the device produces any desired phase in response to a digital control signal. The phase control resolution is optimal and equal over the four quadrants for quadrature input clock signals.

Another object of the present invention is to achieve a very compact implementation of a mixer based clock phase shifter.

Accordingly, the invention is directed to a device for shifting the phase of a high-speed signal over a 360° phase control range, comprising a current switch for generating a first current in a first node and a second current in a second node in accordance with a control digital signal; a first differential block for receiving the high speed signal and the first current, amplitude modulating the high speed signal with the first current, and selectively directing the modulated high speed signal on a first and a second route; a second differential block for receiving a variant of the high speed signal having a known fixed phase difference with the high speed signal and the second current, amplitude modulating the high speed variant with the second current, and selectively directing the modulated high speed variant on a third and a fourth route; a first transmission circuit for connecting the first and second routes to a first summing node and to a second summing node according the control digital signal; a second transmission circuit for connecting the third and fourth routes to the first summing node and to the second summing node according to the control digital signal; and a load network connected to the first and second summing nodes for providing a high-speed output signal with a 360° phase control range.

An important advantage of the programmable phase shifter of the present invention is that compatibility is achieved between different signal types. The programmable features of this circuit are implemented using a hybrid CML-CMOS multiplexer block allowing direct interfacing of CMOS supervisory logic blocks to high speed CML signal paths. This is achieved without the need for CMOS to CML translators and thus represents a significant reduction in active area and power dissipation. Furthermore, this circuit structure does not affect the high frequency operation of the CML signal path. The approach can also be used for other signal types.

Another advantage of this invention is that the phase of the final recovered clock can be adjusted to provide an output range between 0° and 360°.

BRIEF DESCRIPTION OF THE DRAWINGS

The present invention will be described in the following in conjunction with the accompanying drawings in which.

DESCRIPTION OF THE PREFERRED EMBODIMENT

Figure 1:
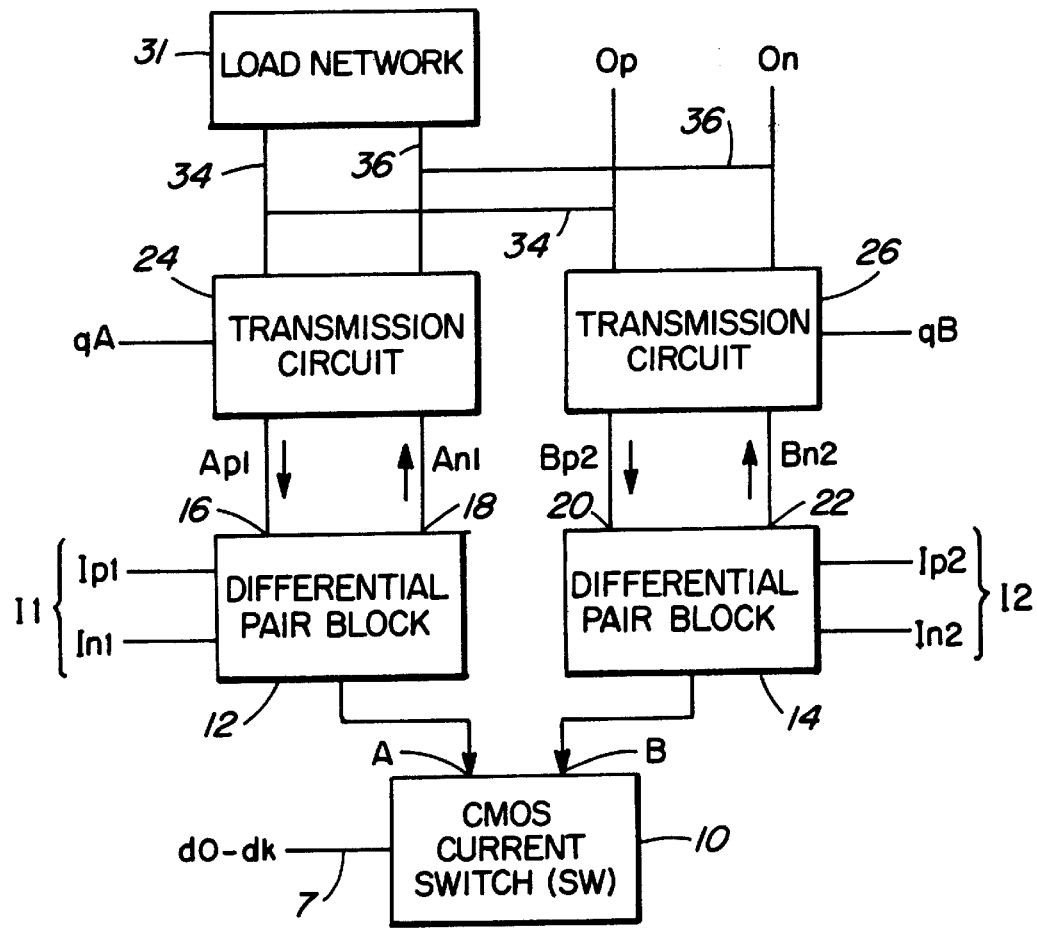
FIG. 1 is a block diagram of the clock phase shifter circuit of the present invention.

FIG. 1 illustrates the block diagram of a phase shifter according to the present invention. A current switch 10 is connected to a first differential block 12 and a second differential block 14 to provide a first current at node A and a second current at node B. The amplitude of the output currents at A and B dependend on the digital word $d_0$ to $d_k$ applied to input 7. CMOS current switch 10 is designed such that an increase in the amplitude of current on path A is mirrored by a similar decrease in the amplitude of the current on path B, and a decrease in the amplitude of current at node A is mirrored by a similar increase in the amplitude of the current at node B.

The first differential block 12 receives a CML/ECL high speed clock signal $I_1$, more precisely input signal $I_{p1}$ and its inverse, $I_{n1}(I_1=I_{p1}+I_{n1})$. The second differential block 14 receives a variant $I_2$ of the high speed clock signal, namely input signal $I_{p2}$ and its inverse, $I_{n2}(I_2=I_{p2}+I_{n2})$. The high speed signal $I_1$ and the variant $I_2$ of the high speed signal are in a known, fixed phase relationship. In the embodiment disclosed and illustrated, quadrature clock signals are used, but it is apparent to a person skilled in the art that the input clocks $I_1$ and $I_2$ need not necessarily be in quadrature and other phase relationships may be used.

Block 12 amplitude modulates the input clock signals $I_{p1}$ and $I_{n1}$ with the current at node A, and gives modulated signals on routes 16 and 18. Route 16 carries a signal $A_{p1}$ in phase with signal $I_{p1}$ and with an amplitude corresponding to the amplitude of current at node A. Modulated signal $A_{n1}$ on route 18 has the phase of signal $I_{n1}$ and an amplitude corresponding to that of the current at node A.

Similarly, block 14 amplitude modulates the input quadrature clocks $I_{p2}$ and $I_{n2}$ with the current at node B, and gives modulated quadrature clock signals on output routes 20 and 22. Output route 20 carries a modulated signal $B_{p2}$ in phase with signal $I_{p2}$ and with an amplitude corresponding to the amplitude of current at node B, while modulated signal $B_{n2}$ on route 22 is in phase with signal $I_{n2}$ and has the amplitude corresponding to that of current at node B. In this way, amplitude modulated clock signals $I_1$ and $I_2$ are available with both polarities and with mirrored amplitudes at the output of the differential pair.

For example, signal $A_{p1}$ is obtained on route 16 when $I_{p1}$ is present at the input of differential pair 12. At the same time, the signal $B_{p2}$ is obtained on route 20 as $I_{p2}$, which is a variant of $I_{p1}$, and is present at the input of differential pair 14. The sum of the normalized amplitudes of signals $A_{p1}$ and $B_{p2}$ on routes 18 and 22 is equal to unity. Similarly, the sum of the normalized amplitudes of signals $A_{n1}$ and $B_{n2}$ on routes 18 and 22 is equal to unity.

Two transmission circuits 24 and 26 reconfigure the signal paths of mixer differential pairs using quadrant defining signals $q_A$ and $q_B$. Amplitude modulated signals $A_{p1}$ and $A_{n1}$, output by differential pair 12, are input to the first transmission circuit 24 and amplitude modulated signals $B_{p2}$ and $B_{n2}$, output by differential pair 14, are input to the second transmission circuit 26. The transmission circuits 24 and 26 are used to selectively invert each modulated signal and to sum the differential signals in summing nodes 34 and 36 respectively, so that a 360° phase control range can be covered, according to the value of the quadrant signals $q_A$ and $q_B$. In fact, the sum is obtained in the load network 31, which can be a simple resistive network.

Figure 2:
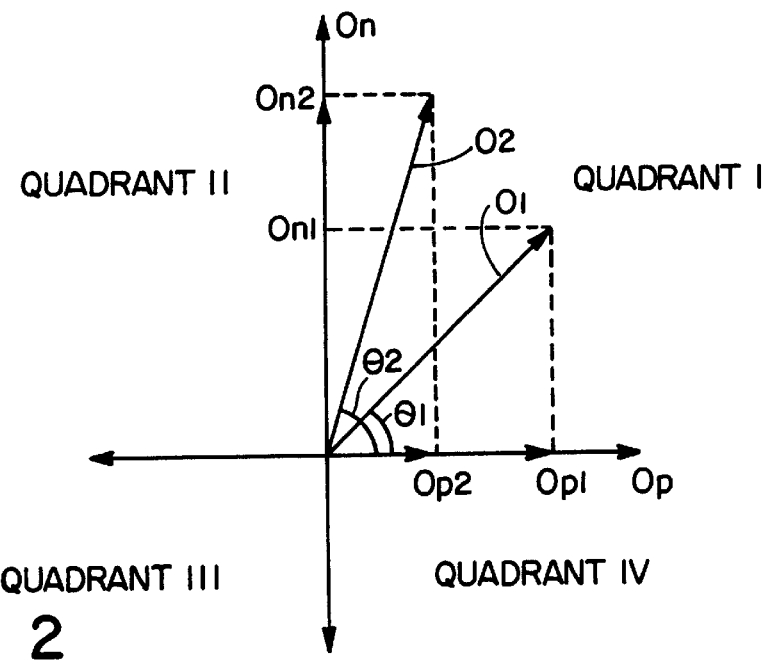
FIG. 2 shows the variation of the output clock phase with the amplitude of the input clock signals.

FIG. 2 and Table 1 illustrate the variation of the output clock phase for various values of the quadrant signals $q_A$ and $q_B$. The output signal $O_p-O_n$ is obtained by combining phasors $(O_1+O_3)-(O_2+O_4)$.

TABLE 1

| $q_A$ | $q_B$ | Summing node 34 | Summing node 36 | Output O | Quadrant |
|---|---|---|---|---|---|
| 0 | 0 | $A_{p1} + B_{p2}$ | $A_{n1} + B_{n2}$ | $+O_p + O_n$ | I |
| 0 | 1 | $A_{p1} + B_{n2}$ | $A_{n1} + B_{p2}$ | $+O_p - O_n$ | II |
| 1 | 1 | $A_{n1} + B_{n2}$ | $A_{p1} + B_{p2}$ | $-O_p - O_n$ | III |
| 1 | 0 | $A_{n2} + B_{p2}$ | $A_{p1} + B_{n2}$ | $-O_p + O_n$ | IV |

It is apparent to a person skilled in the art that phasors illustrated in FIG. 2 and identified as $O_p$ and $O_n$ have an amplitude determined by the value of currents at node A or B and that the amplitude and phase of $O_p$ and $O_n$ determine the phase of the output signal $O(O=O_p+O_n)$.

Angle θ of the output signal O is determined within the quadrant by the relationship between the amplitude of the two component phasors, while signals $q_A$ and $q_B$ determine the quadrant for the phase of the output clock signal.

As shown in FIGS. 1 and 2, and in Table 1, to obtain a recovered clock signal in the first quadrant I, both $q_A$ and $q_B$ should be logic "0". As can be seen in FIGS. 1 and 2, a signal at node 34 is formed with differential signals $A_{p1}$ and $B_{p2}$, and a signal at node 36 is formed with signals $A_{n1}$ and $B_{n2}$. The output signal O between nodes 34 and 36 is $(A_{p1}+B_{p2})-(A_{n1}+B_{n2})=(A_{p1}-A_{n1})+(B_{p2}-B_{n2})=Op+On$. Output signals $O_p$ and $O_n$ have phase angles of 0° and 90° respectively and an amplitude as set according to currents A and B respectively. As illustrated in FIG. 2, the output signal $O_1$, obtained by adding $O_{p1}$ and $O_{n1}$, will have a phase angle $\theta_1$ between 0° and 90°. This angle may be varied by modifying the amplitude of the input clock signals that contribute to the final clock signal. For example, a different phase angle, $\theta_2$ is obtained for a pair of phasors $O_{n2}$ and $O_{p2}$, giving an output clock $O_2$.

When signal $O_n$ is positive and $O_p$ is negative, the resulting output signal O will have a phase angle between 90° and 180°, depending on the amplitude of the currents in nodes A and B. In this case, when the output clock is in the second quadrant (II), $q_A$ should be logic "0" and $q_B$, logic "1".

For an output clock in quadrant III, both $q_A$ and $q_B$ are logic "1". In this case, the output signal O will have a phase which may be varied between 180° and 270°, depending on the amplitude of signals $O_p$ to $O_n$.

To obtain an output clock in quadrant IV, $q_A$ is logic "1" and $q_B$ is logic "0". Signal $O_p$ is positive and $O_n$, is negative, having phases 270° and 0° or 360° respectively. These signals are modulated with the current at node A and B respectively in the differential pairs. The phase of the output clock O may be varied between 270° and 360° by changing the amplitude of differential signals applied to the load network.

Load network 31 is connected across summing nodes 34 and 36 and serves, as indicated above, to add the differential signals for setting the phase of the output signals $O_p$ and $O_n$ in accordance with the digital control signal $d_0-d_k$.

Figure 3:
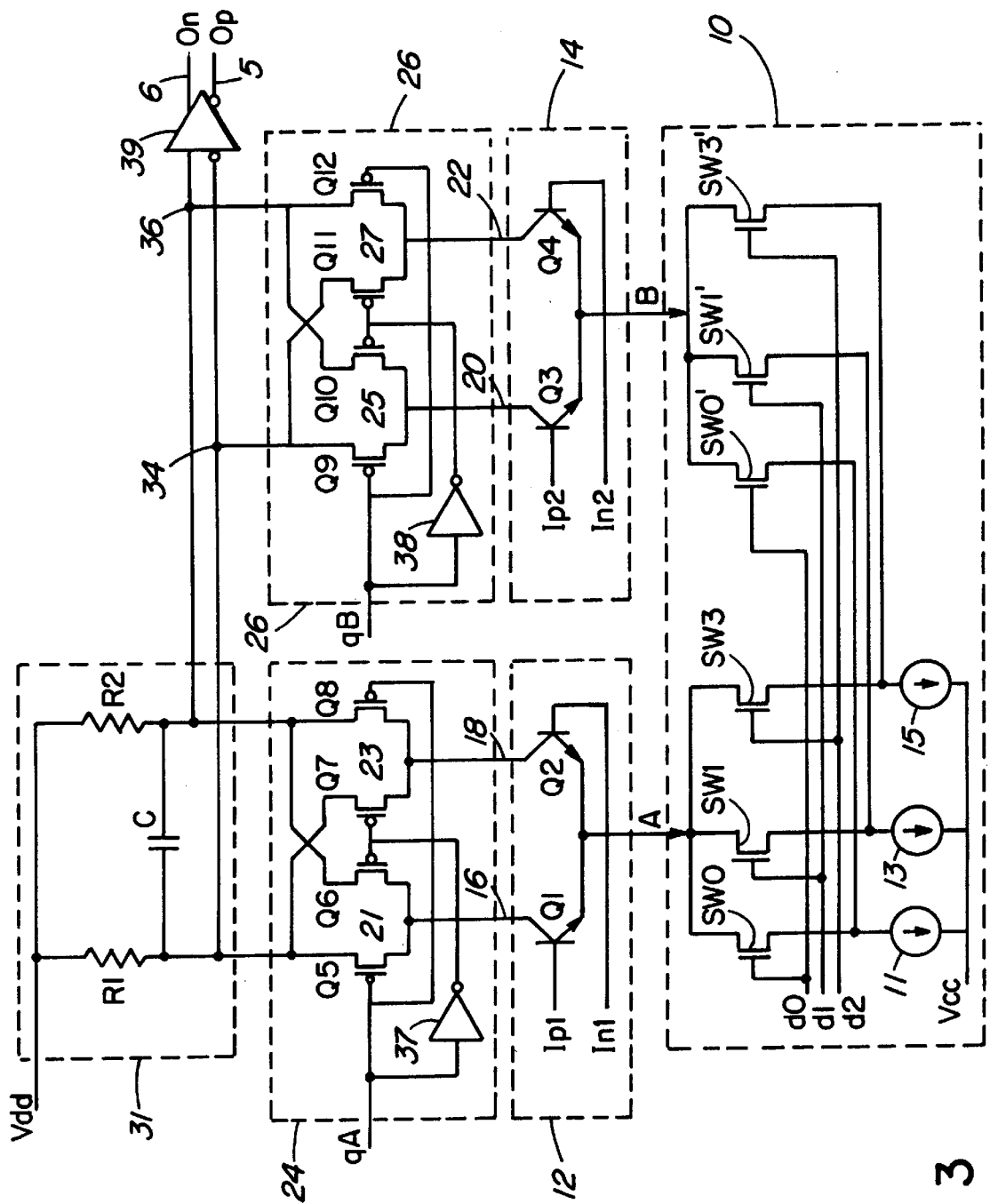
FIG. 3 is a schematic diagram of the circuit of FIG. 1.

The electrical schematic of an embodiment of the invention is illustrated in FIG. 3.

The CMOS current switches $SW_0$ to $SW_m$ and $SW_0'$ to $SW_m'$ of CMOS pairs connected in a parallel arrangement. The operation of the switch will be explained later in further detail in connection with FIGS. 4 and 5. Three current sources 11, 13 and 15 are each connected in series with a CMOS pair $SW_0-SW_0'$, $SW_1-SW_1'$ to $SW_3-SW_3'$, for giving weighted currents A and B. Current source 11, for example, gives a current weighted with coefficient $e_0$ at node A or B, according to the level of signal $d_0$. Similarly, current source 13 gives a current weighted with coefficient $e_1$ at node A or B according to the level of signal $d_1$, and current source 15 gives a current weighted with coefficient $e_2$ at node A or B, according to the level of signal $d_2$. The values of the currents at nodes A and B determine the phase of the signal output, as discussed above in connection with FIGS. 1 and 2. It is apparent to a person skilled in the art that the number of current sources that may be used for the phase shifter may be selected according to the application, as will be explained in connection with FIGS. 4 and 5 in further detail. If higher resolution of the phase angle is desired, the number of current sources may be increased.

It is also apparent that the number k of digits of the control word is selected according to the number of current sources, and that the quadrant signals are preferably part of the control word.

The first differential pair 12 comprises bipolar transistors Q1 and Q2 which are used to modulate the input signals $I_{p1}$ and $I_{n1}$ with current A to give modulated signals $A_{p1}$ and $A_{n1}$ on output terminals 16 and 18. The second differential pair 14 comprises bipolar transistors Q3 and Q4 which are used to modulate input signals $I_{p2}$ and $I_{n2}$ with current B to give modulated signals $B_{p2}$ and $B_{n2}$ on output terminal 20 or 22.

The amplitude of modulated signals $A_{p1}$, $A_{n1}$, $B_{p2}$, and $B_{n2}$ output by differential pairs 12 and 14 is controlled using the CMOS logic controlled current switches connected to the emitter nodes of the differential pairs.

The first transmission circuit 24 comprises a first CMOS pair 21 made of devices Q5 and Q6 and a second pair 23 comprising devices Q7 and Q8. For each pair, the drains are connected together to receive the current in the collector of one of the transistors of the differential pair. Thus, the drains of the first CMOS pair 21 are connected to the collector of transistor Q1, and the drains of the second CMOS pair 23 are connected to the collector of transistor Q2. The sources of devices Q5 and Q7 are connected to node 34 and the sources of devices Q6 and Q8 are connected to node 36.

The control terminals of devices Q5 and Q8 are connected together to receive quadrant signal $q_A$, while the control terminals of devices Q6 and Q7 are connected together to receive the inverted value of $q_A$. An inverter 37 is used for ensuring that devices Q5 and Q8 have a state opposite to the state of devices Q5 and Q6.

When $q_A$ is high, Q5 and Q8 are "off" while Q6 and Q7 are "on". A modulated signal $A_{p1}$ is obtained at summing node 34 through devices Q2 and Q7, and a modulated signal $A_{n1}$ is obtained at summing node 36 through devices Q1 and Q6.

When $q_A$ is low, Q5 and Q8 are "on" while Q6 and Q7 are "off". Now, $A_{p1}$ is obtained at summing node 34, through devices Q1 and Q5, while $A_{n1}$ is obtained at summing node 36 through devices Q2 and Q8.

The second transmission circuit 26 comprises pairs 25 and 27, controlled with quadrant signal $q_B$. As in the case of pairs 21 and 23, the drains of devices Q9 and Q10 are connected together and to the collector of transistor Q3, and the drains of devices Q11 and Q12 are connected to the collector of transistor Q4. The sources of devices Q9 and Q11 are each connected to the summing node 34, and the sources of devices Q11 and Q12 are connected to the summing node 36.

The control terminals of devices Q9 and Q12 are connected together and receive quadrant signal $q_B$, while the control terminals of devices Q10 and Q11 are connected together to receive the inverted value of $q_B$. Inverter 38 is used for ensuring that Q10 and Q11 are "on" when Q9 and Q12 are "off".

When $q_B$ is high, Q9 and Q12 are "off", while Q10 and Q11 are "on". Signal $B_{p2}$ is applied on summing node 36 through devices Q3 and Q10, while signal $B_{n2}$ is obtained at summing node 34 through devices Q4 and Q11.

When $q_B$ is low, Q9 and Q12 are "on" while Q10 and Q11 are "off". Signal $B_{p2}$ is obtained at summing node 34 through devices Q3, Q9, while a signal $B_{n2}$ is obtained at summing node 36 through devices Q4 and Q12.

Signals output by the transmission circuits 24 and 26 are added on load resistors R1 and R2. Capacitor C is provided for filtering, to eliminate high frequency harmonics. The resulting output signals $O_p$ and $O_n$ are passed to a limiting amplifier 39 in order to regenerate a square wave clock output.

Figure 4:
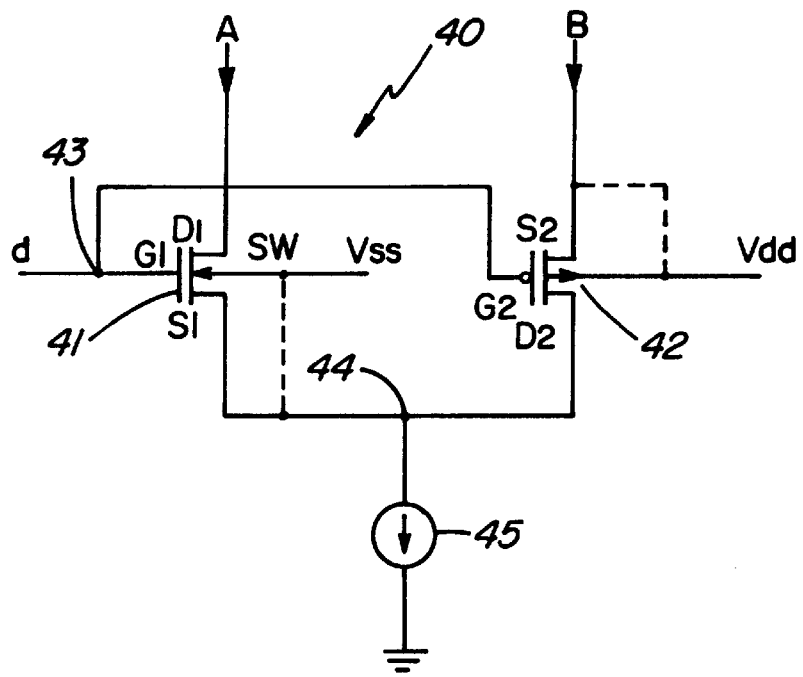
FIG. 4 is a schematic diagram of a current switching circuit (prior art)

The basic current switch 40 which may be used for the CMOS current switch 10 is shown in FIG. 4. This circuit is disclosed in U.S. Pat. No. 5,420,529 (Guay et al., issued May 30, 1995 to Northern Telecom Limited).

The current switch 40 comprises NMOS device 41 and PMOS device 42. Gates G1 and G2 of devices 41 and 42 are connected to node 43 for receiving the digital control signal d. Sources S1 and S2 are connected to node 44 and to a constant current source 45. The current source 45 is connected at the other end to a negative supply rail which may, as shown, be tied to ground, although this is not essential. It is to be understood that the current source may consist of any current source circuit, as will be apparent to one skilled in the art.

The substrate of NMOS device 41 may be connected to $V_{ss}$ or to node 44, while the substrate of PMOS 42 may be connected to Vdd or source S2, as illustrated in broken lines in FIG. 4. The exact configuration chosen is not material to the invention. Drain D1 is connected to node A and source S2 is connected to node B.

The current switch 40 requires a single input and does not need a complementary input or reference level. Signal d is a CMOS input control signal.

In operation, the current from source 45 will be directed in either path between node A or node B and ground, in accordance to the input signal applied on terminal 43. If the input voltage is low, NMOS device 41 is "off" and PMOS device 42 is "on", and the current generated by source 45 flows at node B. When the input voltage is high, device 41 is "on" and device 42 is "off". An output current generated by constant current source 45 will flow from node A to ground.

The region of operation of the complementary MOS devices in the "on" state will be determined by the circuit attached to nodes A and B. The complementary MOS devices are also selected so that their drain to source voltage in the "on" state is small enough to keep the current source in its high impedance region.

Figure 5:
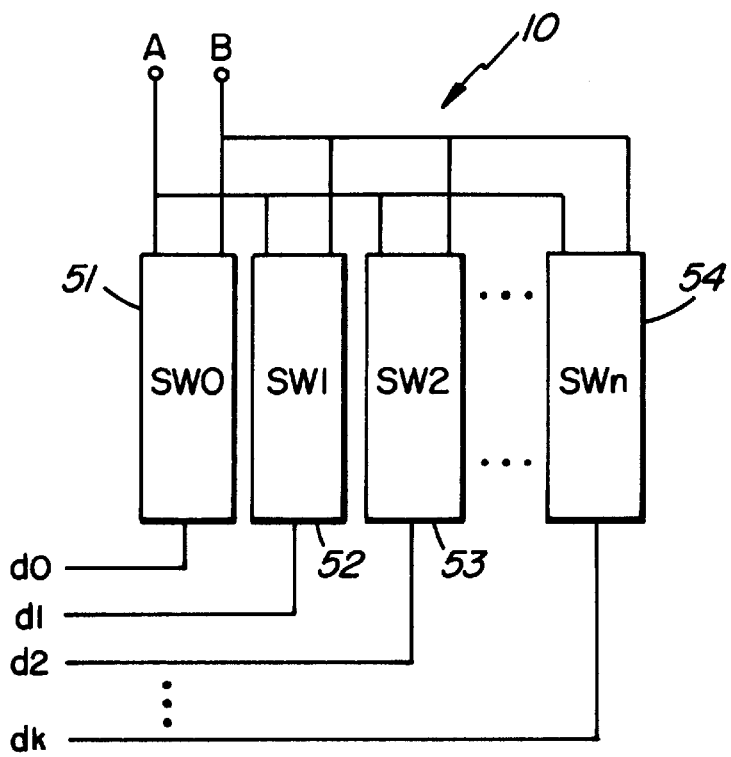
FIG. 5 is a block diagram of a variable current switching circuit according to this invention.

FIG. 5 illustrates a block diagram of a the CMOS current switch 10 used in the present invention. The value of the currents may be adjusted if a plurality of current switches of the type illustrated in FIG. 4 are connected in parallel. The value of output current at node A may be preset using the digital word $d_0$ to $d_n$, which determines which of the current switches participate in forming this current.

The sources receiving logic "1" form the current at node A, and the sources receiving logic "0" form the current at node B. If, for example, a four digit control signal is applied on bus 7, with $d_0=1$, $d_1=0$, $d_2=1$ and $d_3=1$, the current at node A is formed with the currents generated by $SW_0$, $SW_2$ and $SW_3$, and the current at node B is formed by the current generated by $SW_1$.

A great flexibility in selecting the value of the current at node A may be obtained if different weights are attributed to each of $SW_0$ to $SW_n$. Current switches with weighted current levels could be used, each giving a value of current incremented in binary steps. For example, current source 51 may be selected to have a weight of $e_0$, current source 52 a weight $e_1$, current source 53 a weight $e_2$, and the current source 54 a weight $e_k$, where k is the number of sources less one.

Figure 6:
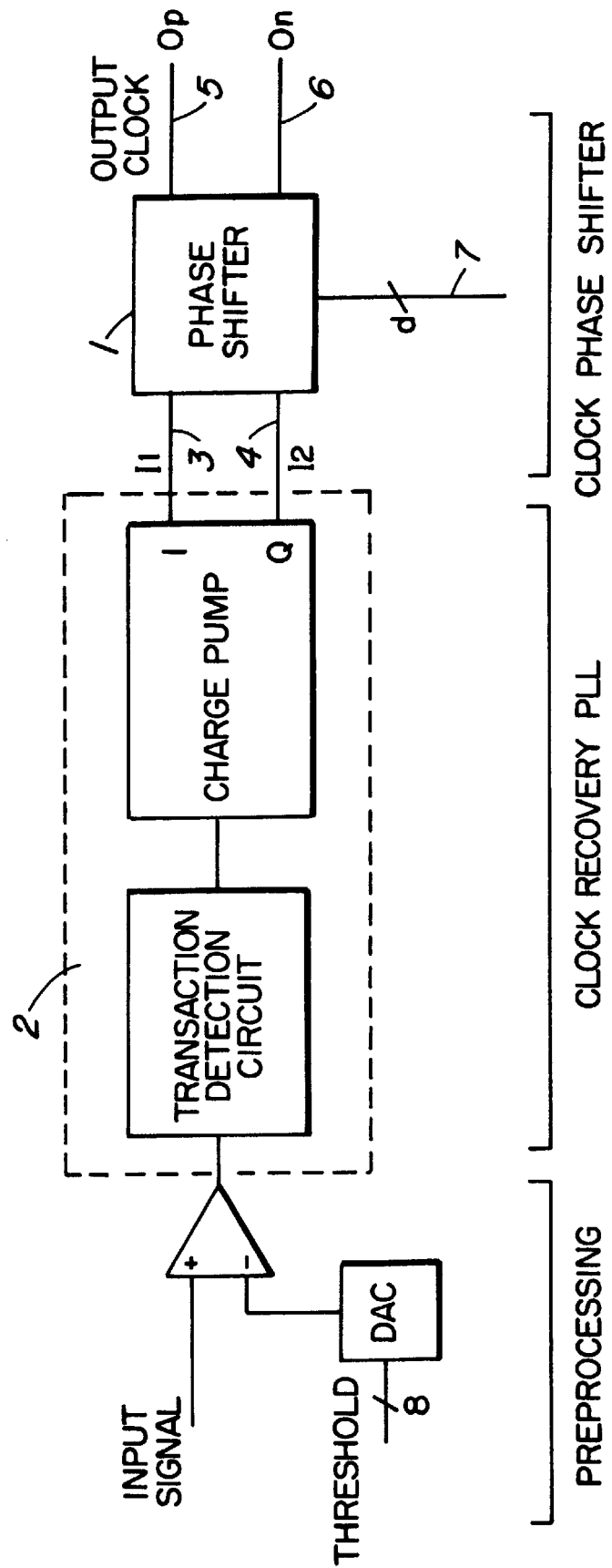
FIG. 6 is a block diagram of a clock recovery circuit with the clock phase shifter of this invention.

FIG. 6 generally illustrates a block diagram of an application of the phase shifter of this invention for a clock recovery circuit. As seen in FIG. 1, the phase shifter 1 is connected at the output of clock recovery PLL block 2 and operates on the PLL output clock and its quadrature component. The phase shifter 1 receives the clock output I and the quadrature clock Q, on inputs 3 and 4 respectively. The output clocks $O_p$ and $O_n$, obtained at terminals 5 and 6, are phase controlled with a digital control signal $d_0$ to $d_n$ applied on terminal 7.

Figure 7:
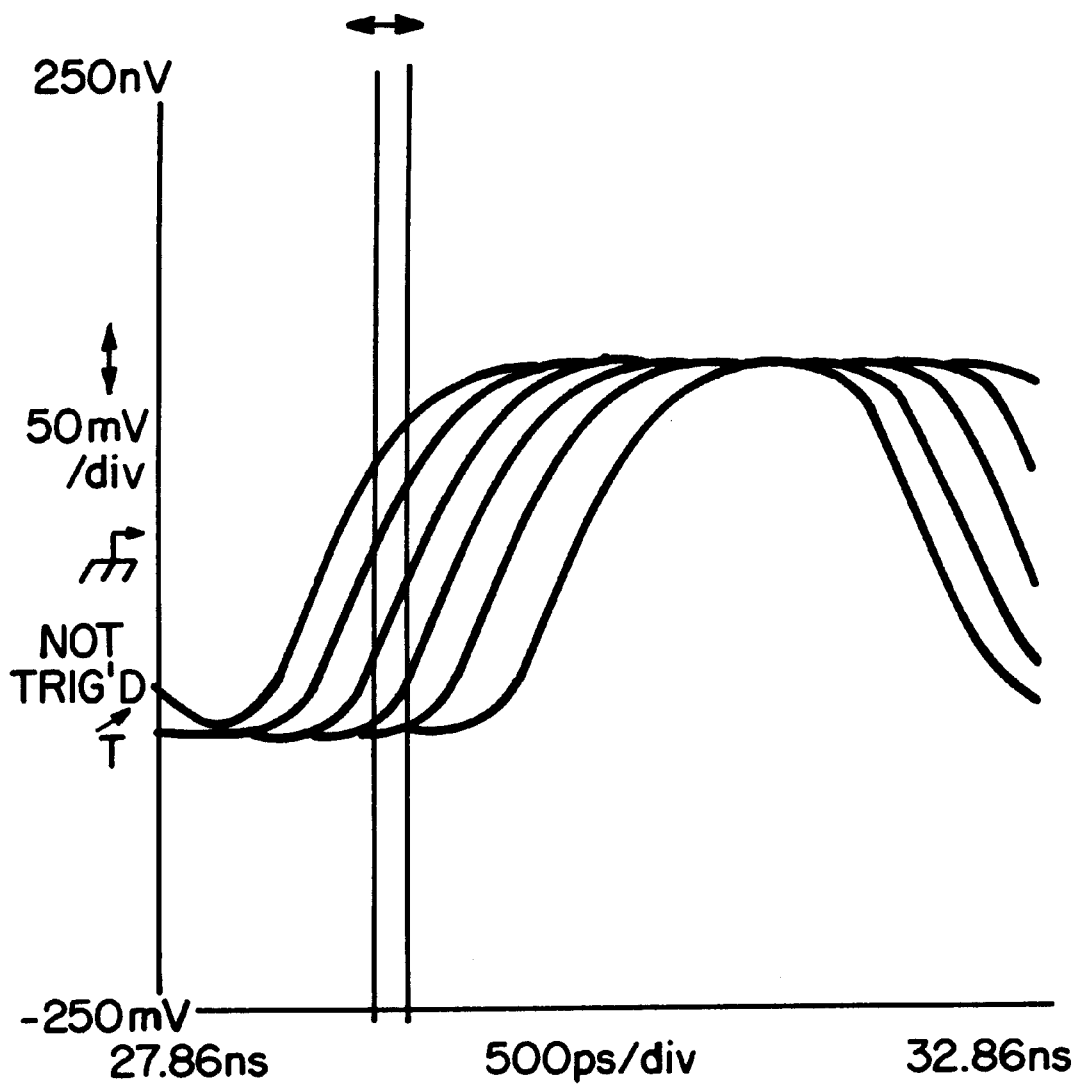
FIG. 7 is a graph showing the output voltage against time for various values of the control signal.

FIG. 7 is an oscilloscope plot showing the measured effects of changing the control word to the phase shifter using an "infinite persistence" mode of display. The clock is running at 200 MHz, and the phase shifter implemented has 8-bit resolution, namely two bits for $q_A$ and $q_B$, and six bits resolution for the A and B weighted currents.

The illustrated step size of approximately 200 ps is the result of changing the 4th least significant bit. Toggling the least significant bit would only amount to approximately 5 ps change. This is below the resolution of the oscilloscope to show accurately.

While a specific embodiment of the invention has been illustrated and described it will be obvious to one skilled in the art that variations and alternatives can be made to the invention. Such variations and alternatives, however, are understood to come within the scope of the invention as defined by the appended claims.

What is claimed is:

1. A device for shifting the phase of a high-speed signal over a 360° phase control range, comprising:

a current switch including a current source for injecting a control current to a common node and a pair of CMOS devices having the sources connected to said common node, the gates connected together to receive a control digital signal and the drains connected respectively to a first and second node for steering a first and a second current into said first and second nodes respectively;

a first differential block for receiving said high speed signal and said first current, amplitude modulating said high speed signal with said first current, and selectively directing said modulated high speed signal on a first and a second route;

a second differential block for receiving a variant of said high speed signal having a known fixed phase difference with said high speed signal, and said second current, amplitude modulating said high speed variant with said second current, and selectively directing said modulated high speed variant on a third and a fourth route;

a first transmission circuit for connecting said first and second routes to a first summing node and to a second summing node according to said control digital signal;

a second transmission circuit for connecting said third and fourth routes to said first summing node and to said second summing node according to said control digital signal; and a load network connected to said first and second summing nodes for providing a high-speed output signal with said 360° phase control range.

2. A device as claimed in claim 1, wherein said first differential block comprises:

a first and a second transistor, each having an emitter, a collector and a base, the emitters being connected to said first node and the collectors being connected to said first and second routes respectively;

means for applying said high speed signal on the base of said first transistor; and means for applying the inverse of said high speed signal on the base of said second transistor.

3. A device as claimed in claim 1, wherein said second differential block comprises:

a third and a fourth transistor, each having an emitter, a collector and a base, the emitters being connected to said second node and the collectors being connected to said third and fourth routes respectively;

means for applying said variant of said high speed signal on the base of said third transistor; and means for applying the inverse of said variant of said high speed signal on the base of said fourth transistor.

4. A device as claimed in claim 1, wherein said first transmission circuit comprises;

a first switch connected on said first route for switching said modulated high speed signal between said first and second summing nodes according to a first quadrant digit comprised in said control digital signal; and a second switch connected on said second route for switching the inverse of said modulated high speed signal between said first and second summing nodes according to said first quadrant digit.

5. A device as claimed in claim 4, wherein said first switch comprises a pair of CMOS devices having drains connected together and to said first route, sources connected to said first and second summing nodes respectively, and gates connected to receive said first quadrant digit and the inverse of said first quadrant digit, respectively.

6. A device as claimed in claim 4, wherein said second switch comprises a pair of CMOS devices having drains connected together and to said second route, sources connected to said first and second summing nodes respectively, and gates connected to receive the inverse of said first quadrant digit and said first quadrant digit, respectively.

7. A device as claimed in claim 1 wherein said second transmission circuit comprises;

a third switch connected on said third route for switching said modulated high speed variant between said first and second summing nodes according to a second quadrant digit comprised in said control digital signal; and a fourth switch connected on said fourth route for switching the inverse of said modulated high speed variant between said first and second summing nodes according to said second quadrant digit.

8. A device as claimed in claim 7, wherein said third switch comprises a pair of CMOS devices having drains connected together and to said third route, sources connected to said first and second summing nodes respectively, and gates connected to receive said second quadrant digit and the inverse of said second quadrant digit, respectively.

9. A device as claimed in claim 7, wherein said fourth switch comprises a pair of CMOS devices having drains connected together and to said fourth route, sources connected to said first and second summing nodes respectively, and gates connected to receive said second inverse quadrant digit and the said second quadrant digit.

10. A device as claimed in claim 1 wherein said load network comprises:

a first resistor connected between said first summing node and a power supply terminal; and a second resistor connected between said second summing node and said power supply terminal.

11. A device as claimed in claim 1, wherein said current switch comprises:

a plurality (K) of current sources each for injecting a control current to a respective k-order common node;

a plurality (K) of pairs of CMOS devices, each k-order pair including a first and second CMOS device, each CMOS device having a source, a gate and a drain, the source of said first CMOS device and the drain of said second CMOS device being connected together and to said respective k-order common node, the gates connected together to receive a k-order digit of said control signal, and the drain of said first CMOS device and the source of said second CMOS device being connected respectively to said first and second nodes for steering a constituent current into said first node and a complementary constituent current into said second node according to said k-order digit; wherein K is the number of current sources and k$\epsilon$[1,K].

12. A device as claimed in claim 11, wherein the sum of said constituent currents from said k pairs of CMOS devices form said first current and the sum of said complementary constituent currents from said k pairs of CMOS devices form said second current.

13. A device as claimed in claim 12, wherein the sum of normalized amplitudes of said first and second currents obtained at said first and second nodes is equal to unity.

14. A device for shifting the phase of a high-speed signal over a 360° phase control range, comprising:

means for distributing a control current generated with a current source, to provide a first current to a first node and a second current to a second node, the amplitudes of said first and second currents being adjustable in accordance with a control digital signal, so that the sum of the normalized amplitudes of said first and said second currents is equal to unity;

a first differential block for receiving said high speed signal and said first current, amplitude modulating said high speed signal with said first current, and selectively directing said modulated high speed signal along a first and a second route;

a second differential block for receiving a variant of said high speed signal having a known fixed phase difference with said high speed signal, and said second current, amplitude modulating said high speed variant with said second current, and selectively directing said modulated high speed variant along a third and a fourth route;

a first transmission circuit for connecting said first and second routes to a first summing node and to a second summing node according said control digital signal;

a second transmission circuit for connecting said third and fourth routes to said first summing node and to said second summing node according to said control digital signal; and a load network connected to said first and second summing nodes for providing a high-speed output signal with said 360° phase control range.

* * * * *